(12) United States Patent
Miyachi et al.

(10) Patent No.: US 9,024,332 B2
(45) Date of Patent: May 5, 2015

(54) SEMICONDUCTOR LIGHT EMITTING ELEMENT

(71) Applicant: Stanley Electric Co., Ltd., Tokyo (JP)

(72) Inventors: Mamoru Miyachi, Okegawa (JP); Tatsuma Saito, Yokohama (JP); Takako Chinone, Tokyo (JP); Takanobu Akagi, Yokohama (JP)

(73) Assignee: Stanley Electronic Co., Ltd., Tokyo (JP)

( * ) Notice: Subject to any disclaimer, the term of this patent is extended or adjusted under 35 U.S.C. 154(b) by 151 days.

(21) Appl. No.: 13/845,063

(22) Filed: Mar. 17, 2013

(65) Prior Publication Data

US 2013/0248918 A1    Sep. 26, 2013

(30) Foreign Application Priority Data

Mar. 21, 2012    (JP) .................................. 2012-063913

(51) Int. Cl.
*H01L 27/15* (2006.01)
*H01L 33/32* (2010.01)
(Continued)

(52) U.S. Cl.
CPC ............ *H01L 33/32* (2013.01); *H01L 33/0079* (2013.01); *H01L 33/20* (2013.01); *H01L 33/38* (2013.01); *H01L 33/0095* (2013.01); *H01L 2224/29164* (2013.01); *H01L 23/4824* (2013.01); *H01L 24/24* (2013.01); *H01L 24/29* (2013.01); *H01L 24/82* (2013.01); *H01L 24/83* (2013.01); *H01L 24/94* (2013.01); *H01L 2224/29139* (2013.01); *H01L 2224/29144* (2013.01); *H01L 2224/29147* (2013.01); *H01L 2224/83001* (2013.01); *H01L 2224/92244* (2013.01); *H01L 2924/10156* (2013.01); *H01L 2224/29155* (2013.01); *H01L 2924/01322* (2013.01); *F21S 48/115* (2013.01); *F21S 48/215* (2013.01); *H01L 2924/12041* (2013.01)

(58) Field of Classification Search
USPC ....................................................... 257/79, 97
See application file for complete search history.

(56) References Cited

U.S. PATENT DOCUMENTS 7,256,483 B2    8/2007    Epler et al.
7,488,621 B2    2/2009    Epler et al.
(Continued)

FOREIGN PATENT DOCUMENTS

JP          2006-128710 A     5/2006

*Primary Examiner* — David Vu
*Assistant Examiner* — Brandon Fox
(74) *Attorney, Agent, or Firm* — Holtz, Holtz, Goodman & Chick PC

(57) ABSTRACT

A semiconductor light emitting element has a cross-sectional structure comprising a support substrate, a semiconductor lamination located over the support substrate, and a joint layer located between the semiconductor lamination and the support substrate, containing a first jointing layer located on the semiconductor lamination side and a second jointing layer located on the support substrate side. In the plan view, the semiconductor lamination has corner portions and side portions along the periphery, the first jointing layer is encompassed by the second jointing layer, the second jointing layer is encompassed by the semiconductor lamination, and an annular region defined between outlines of the semiconductor lamination and of the first jointing layer has first portions corresponding to the corner portions of the semiconductor lamination and second portions corresponding to the side portions of the semiconductor lamination, widths of the first portions being narrower than widths of the second portions.

6 Claims, 11 Drawing Sheets

(51) Int. Cl.
  *H01L 33/00* (2010.01)
  *H01L 33/20* (2010.01)
  *H01L 33/38* (2010.01)
  *H01L 23/482* (2006.01)
  *H01L 23/00* (2006.01)
  *F21S 8/10* (2006.01)

(56) References Cited

U.S. PATENT DOCUMENTS

| | | | |
|---|---|---|---|
| 7,875,533 | B2 | 1/2011 | Epler et al. |
| 2011/0084301 | A1 | 4/2011 | Epler et al. |
| 2013/0146936 | A1* | 6/2013 | Tsai et al. .............. 257/99 |

* cited by examiner

SEMICONDUCTOR LIGHT EMITTING ELEMENT

CROSS REFERENCE TO RELATED APPLICATION

This application is based upon and claims the benefit of priority of the prior Japanese Patent Application No. 2012-063913, filed on Mar. 21, 2012, the entire contents of which are incorporated herein by reference.

FIELD OF THE INVENTION

This invention mainly relates to a semiconductor light emitting element and its manufacture.

BACKGROUND

Light-emitting diodes (LEDs) based on nitride semiconductors, such as GaN (gallium nitride), are capable of emitting a spectrum of light ranging from ultraviolet light to blue light and the application of a fluorescent substance enables them to emit white light. LEDs capable of generating high-output white light are used for vehicle lights and other applications.

Such LEDs have a semiconductor lamination containing at least an n-type semiconductor layer, an active layer for light emission, and p-type semiconductor layer. On the p-type semiconductor layer side of a layered semiconductor structure, a p-side transparent electrode and a reflector electrode are formed covering almost the entire light emitting region. On the n-type semiconductor layer side of the layered semiconductor structure, an n-side electrode is selectively formed. A part of the light emitted from the active layer is released directly from the n-type semiconductor layer. The rest is released from the n-type semiconductor layer after being reflected off the reflector electrode placed on the p-type semiconductor layer side.

When nitride-based semiconductors are used in a layered semiconductor structure, a growth substrate, for example, a sapphire substrate, is employed to enable such nitride-based semiconductors to grow. However, a sapphire substrate is poor in heat dissipation due to its low thermal conductivity, and is therefore unsuitable for high-output LED devices that draw large currents. In recent years, therefore, a method that, after growing nitride semiconductors grow over a sapphire or other growth substrate, secures those nitride semiconductors over a silicon or other support substrate with excellent heat dissipation, and peels the growth substrate off the semiconductor lamination by laser lift-off (for example, see Japanese Laid-open Patent Publication No. 2006-128710).

SUMMARY

According to one aspect of this invention, there is provided a semiconductor light emitting element having a cross-sectional structure comprising:

a support substrate;

a semiconductor lamination located over the support substrate, containing at least a p-type semiconductor layer, an active layer having a light emitting characteristic and an n-type semiconductor layer, and having a reverse-tapered overall cross-sectional shape relative to the support substrate; and a joint layer located between the semiconductor lamination and the support substrate, containing a first jointing layer located on the semiconductor lamination side and a second jointing layer located on the support substrate side, and fixing the positional relationship between the semiconductor lamination and the support substrate by joining the first and second jointing layers, wherein in a plan view:

the semiconductor lamination has corner portions and side portions along the periphery;

the first jointing layer is encompassed by the second jointing layer;

the second jointing layer is encompassed by the semiconductor lamination; and an annular region defined between an outline of the semiconductor lamination and an outline of the first jointing layer has first portions corresponding to the corner portions of the semiconductor lamination and second portions corresponding to the side portions of the semiconductor lamination, widths of the first portions being narrower than widths of the second portions.

According to another aspect of this invention, there is provided a method of manufacturing a semiconductor light emitting element comprising step of:

(a) forming over a growth substrate, a semiconductor lamination containing at least an n-type semiconductor layer, an active layer having a light emitting characteristic and a p-type semiconductor layer, and having a normal-tapered overall cross-sectional shape relative to the growth substrate and a plan shape containing side portions and corner portions along the periphery;

(b) forming over the semiconductor lamination, a first jointing layer that appears encompassed by the semiconductor lamination in their plan view;

(c) forming over a support substrate, a second jointing layer that appears encompassed by the semiconductor lamination and encompassing the first jointing layer in their plan view when facing the support substrate having the second jointing layer with the growth substrate having the semiconductor lamination and the first jointing layer;

(d) disposing the growth substrate and the support substrate in such a manner that the first jointing layer and the second jointing layer are faced, and forming a jointed structure, by jointing the first and the second jointing layer, containing the growth substrate, the semiconductor lamination, the first and second jointing layer and the support substrate; and (e) removing the growth substrate from the jointed structure, wherein in step (b), an annular region defined between an outline of the semiconductor lamination and an outline of the first jointing layer has first portions corresponding to the corner portions of the semiconductor lamination and second portions corresponding to the side portions of the semiconductor lamination, widths of the first portions being narrower than widths of the second portions.

The object and advantages of the invention will be realized and attained by means of the elements and combinations particularly pointed out in the claims.

It is to be understood that both the foregoing general description and the following detailed description are exemplary and are not restrictive of the invention, as claimed.

DESCRIPTION OF THE PREFERRED EMBODIMENTS

A manufacturing method for a semiconductor light emitting element according to Embodiment 1 is described below with reference to FIGS. 1A to 2L.

Figure 1A:
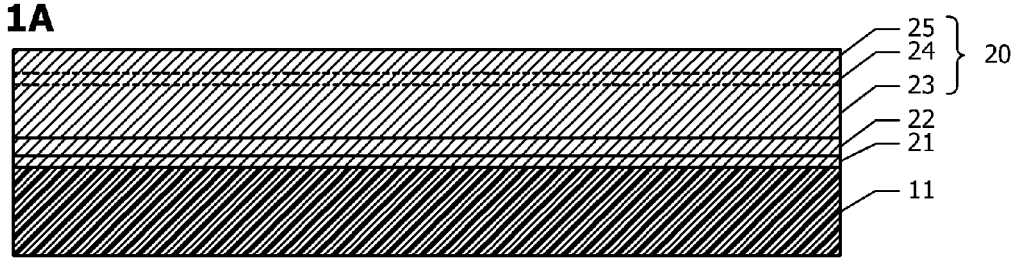
FIGS. 1A to 1L are cross sections illustrating the process involved in the manufacture of a semiconductor light emitting element according to a first embodiment.

A semiconductor lamination formation step is carried out first. Using the MOCVD (metal organic chemical vapor deposition) technique, a buffer layer 21, foundation layer 22, and semiconductor lamination 20 that consists mainly of a first semiconductor layer (n-type semiconductor layer) 23, active layer 24, and second semiconductor layer (p-type semiconductor layer) 25 are staked on a C-plane sapphire growth substrate 11 to form an optical semiconductor wafer as illustrated in FIG. 1A. Each layer is formed of a nitride semiconductor as represented as $Al_xIn_yGa_{1-x-y}N$ ($0 \le x \le 1$, $0 \le y \le 1$). The n-type semiconductor layer 23 contains, for example, Si as an n-type dopant while the p-type semiconductor layer 25 contains, for example, Mg as a p-type dopant. Here, the semiconductor lamination 20 may contain other layers such as clad layer and contact layer, as required, in addition to the above three, in order to improve the light emitting efficiency. The active layer 24, furthermore, may have a multiple quantum well structure.

Subsequently, a step for producing elements from the semiconductor wafer is carried out. The p-type semiconductor layer 25 is activated first. Specifically, it is heat-treated in a vacuum or inert gas atmosphere at 400° C. or more.

Figure 1B:
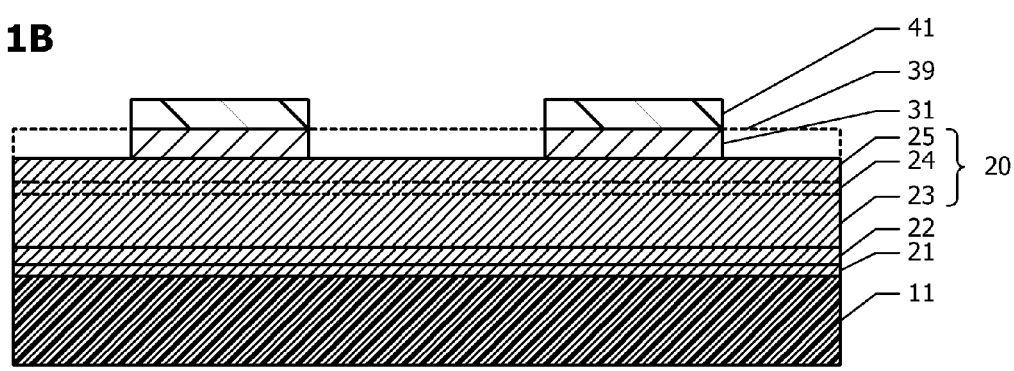

Then, a transparent electrode 31 made of, for example, ITO (indium tin oxide) is formed on the surface of the p-type semiconductor layer 25 as illustrated in FIG. 1B. An ITO film 39 (indicated by a broken line in the figure) is formed over the entire surface of the p-type semiconductor layer 25 by RF sputtering to form a film with a thickness of, for example, about 10 nm. During this step, the substrate temperature is heated at 150° C. to 300° C. Since the crystallization of ITO is promoted as the substrate temperature is increased up to 150° C. or more during film formation, it is preferable that the substrate is heated at 200° C. to 250° C. Here, it is preferable that the ITO film 39 (transparent electrode 31) is as thin as practical from the viewpoint of improving the light extraction efficiency.

Subsequently a photoresist 41 of a desired shape is formed by photolithography on the ITO film 39. Then, the ITO film 39 is wet-etched using the photoresist 41 as mask to form a patterned transparent electrode 31. The etchant used for ITO in the present embodiment was a generally available commercial product containing nitric acid and hydrochloric acid. The photoresist 41 is removed after the formation of a transparent electrode 31.

Subsequently, the transparent electrode 31 is heated in an oxygen-containing atmosphere at a temperature of 400° C. to 700° C., preferably 450° C. to 600° C. For this embodiment, it is heat-treated at 450° C. for 1 min. This heat treatment causes ohmic contact between the p-type semiconductor layer 25 and the transparent electrode 31.

Figure 1C:
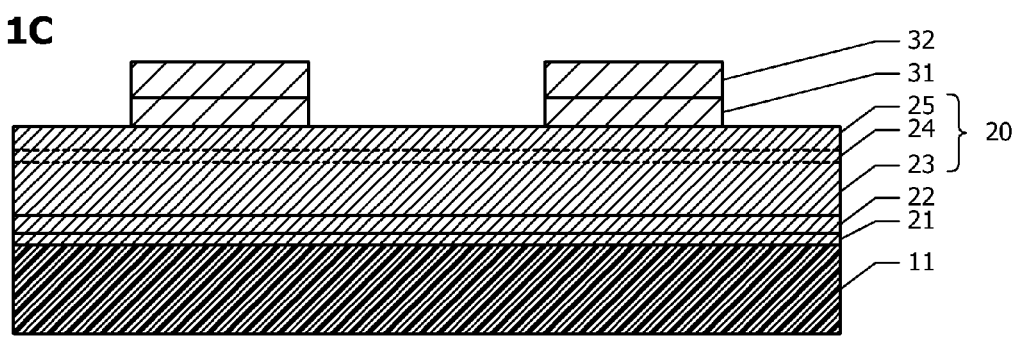

Subsequently, for example, Ag is deposited by RF sputtering on the transparent electrode 31 to form a light reflection layer 32 as illustrated in FIG. 1C. Useful materials for the light reflection layer 32 include Ag,Al,Rh,Pd,and alloys thereof that have a high reflectance for the light emitted from the active layer 24. It is preferable that the light reflection layer 32 has a relatively large thickness of, for example, 100 nm or more, from the viewpoint of improving the light extraction efficiency.

Figure 1D:
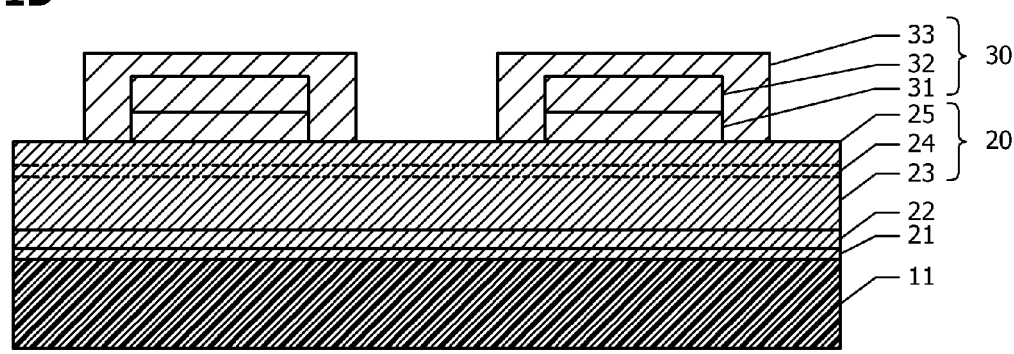

Next, a multi-layered metal film such as, for example, TiW/Ti/Pt/Au is formed by the lift-off technique to form a cap layer 33 that covers the transparent electrode 31 and the light reflection layer 32 as illustrated in FIG. 1D. The cap layer 33 depresses the migration of the light reflection layer 32, which contains Ag. The cap layer 33 may be made of an appropriate material that can depress the migration of the light reflection layer 32 and will not migrate itself.

Thus, a p-side electrode 30 containing a transparent electrode 31, light reflection layer 32, and cap layer 33 is formed on a p-type semiconductor layer 25 by carrying out these steps.

Figure 1E:
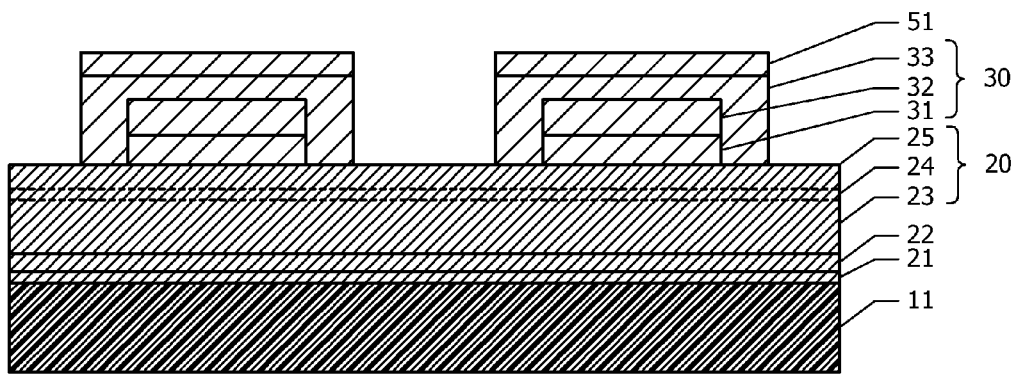

Next, a first jointing layer 51 of, for example, Au, AuSn, or Cu is formed by lift-off on the cap layer 33 as illustrated in FIG. 1E. The plan shape of the first jointing layer 51 will be described later (see FIG. 3).

Figure 1F:
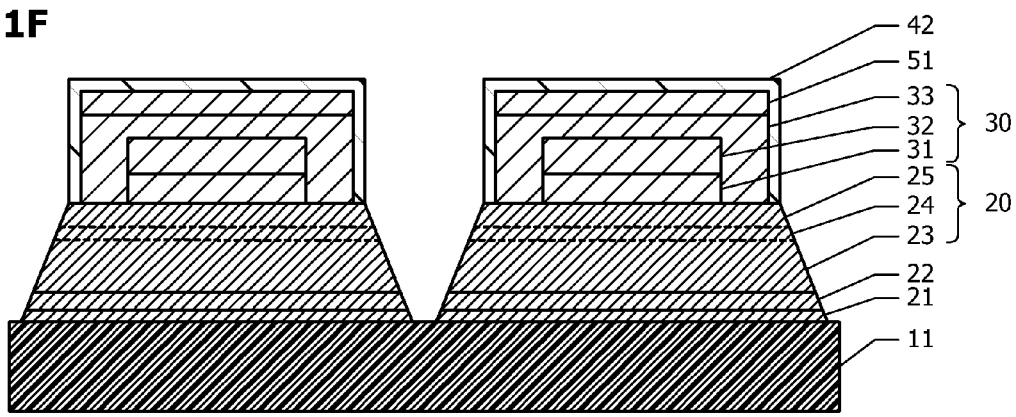

Subsequently, as an element separation step, the photoresist 42 is used to divide the semiconductor lamination 20 into elements with a desired size as illustrated in FIG. 1F. The division of the semiconductor lamination 20 is performed by, for example, reactive ion etching (RIE). The semiconductor lamination 20 is etched after adjusting the process pressure to 1 Pa at an antenna output of 650 W, bias output of 350 W, and chlorine gas flow rate of 30 sccm. At this point, the semiconductor lamination 20 has a normal-tapered overall cross-sectional shape relative to the growth substrate 11. This allows the semiconductor lamination 20 to be divided into individual semiconductor light emitting elements. The photoresist 42 is removed after completion of the element separation step.

Figure 1G:
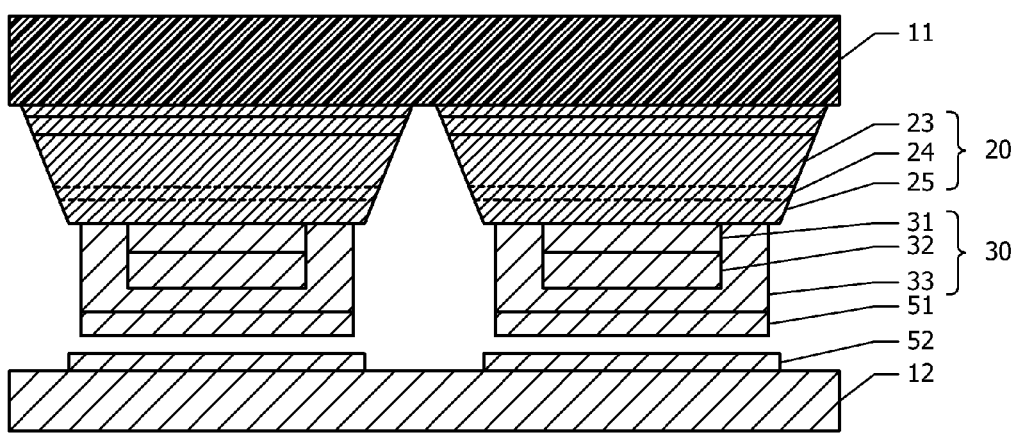

Subsequently, a jointing step is carried out. As illustrated in FIG. 1G, the semiconductor wafer (semiconductor lamination 20) is jointed to a support substrate 12. The support substrate 12 may be made of, for example, n-type Si or SiC. The support substrate 12 has a second jointing layer 52 formed on its surface. The second jointing layer 52 is made of, for example, AuSn. It is preferable that the second jointing layer 52 has a thickness of 1 to 2 μm. The plan shape of the second connection layer 52 will be described later along with the plan shape of the first connection layer 51 (see FIG. 3).

The first jointing layer 51, which is integrated with the growth substrate 11, and the second jointing layer 52, which is integrated with the support substrate 12, are joined. Then, the first and second jointing layers 51 and 52 are joined by eutectic crystallization of the joint interface (joint layer). For the present embodiment, they are joined by, for example, heating at 320° C. for 5 min under a pressure of 350 kg (thermocompression bonding). This fixes the p-side electrode 30 and the semiconductor lamination 20 on the support substrate 12. Hereinafter, the structure made up of the growth substrate 11, which carries semiconductor lamination 20, and the support substrate 12 with the joint layer (first and second jointing layers 51 and 52) interposed in between is referred to as the jointed structure.

Subsequently, a growth substrate peeling step is carried out. This step uses the LLO (laser lift-off) technique. The laser beam to be used is a high output pulse laser that has an energy large enough to decompose a GaN semiconductor. For example, a KrF (krypton-fluorine) excimer laser with a wavelength of 248 nm and irradiation energy density of 800 to 900 mJ/cm$^2$ is used.

Figure 1H:
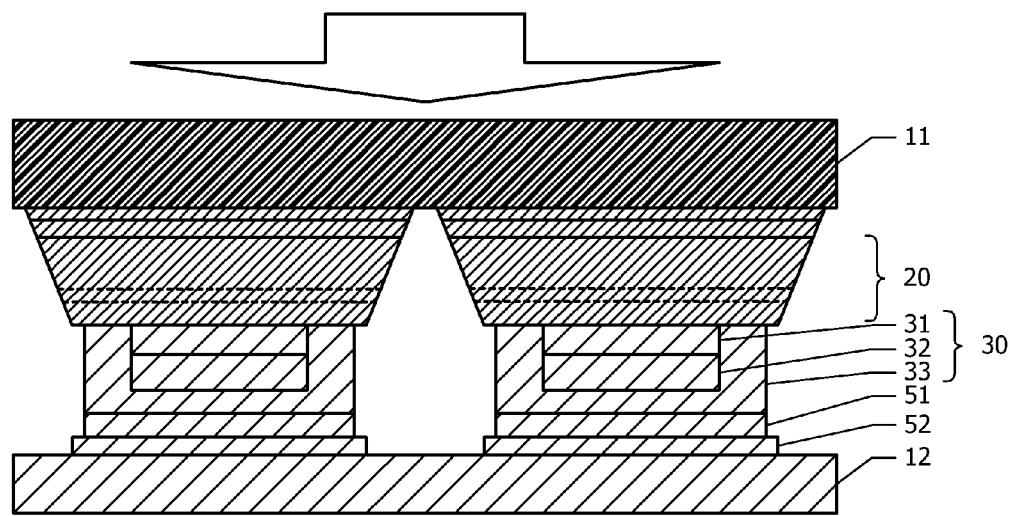
Figure 1I:
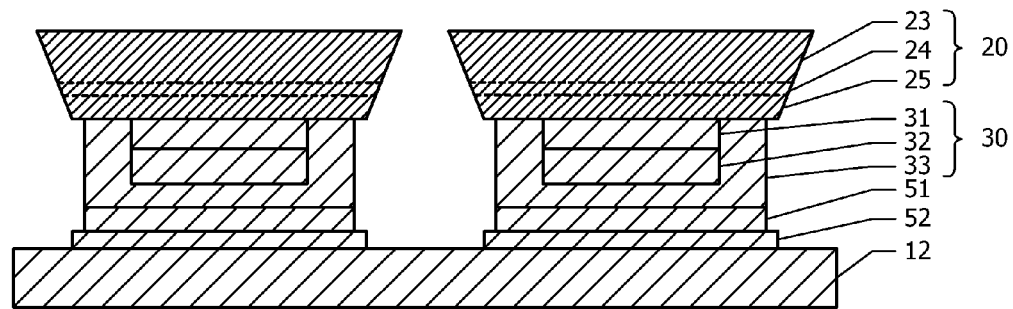

A laser beam is irradiated through the back of the growth substrate 11 as illustrated in FIG. 1H. As a result, the buffer layer 21 and the foundation layer 22 are partly decomposed so that the growth substrate 11 and the GaN semiconductor lamination 20 are separated, leading to a state as illustrated in FIG. 1I. In other words, a state as illustrated in FIG. 1I is achieved by removing the growth substrate 11 from the jointed structure. The Ga (gallium) residue from the laser lift-off processing is removed with, for example, hot water and then the surface is treated with hydrochloric acid. Consequently, the n-type semiconductor layer 23 is exposed. At this point, the semiconductor lamination 20 has a reverse-tapered overall cross-sectional shape relative to the support substrate 12. Any agent may be used for the surface treatment as long as it can etch a nitride semiconductor, and useful ones include acid and alkali chemicals such as phosphoric acid, sulfuric acid, potassium hydroxide, and sodium hydroxide. The surface treatment may be carried out by dry etching using argon plasma or chlorine plasma or by polishing.

Furthermore, the surface of the n-type semiconductor layer 23 may be treated with Cl or Ar by a dry etching apparatus such as for RIE and smoothed by a polishing apparatus such as for CMP (chemical mechanical polishing) to remove laser damage portions and laser damage layers. Here, it is preferable that fine cone-like structures (so-called micro-cone structures) are formed on the exposed surface of the n-type semiconductor layer 23 to improve the light extraction efficiency. Micro-cone structures can be formed by immersing the surface of the n-type semiconductor layer 23 in, for example, potassium hydroxide.

Figure 1J:
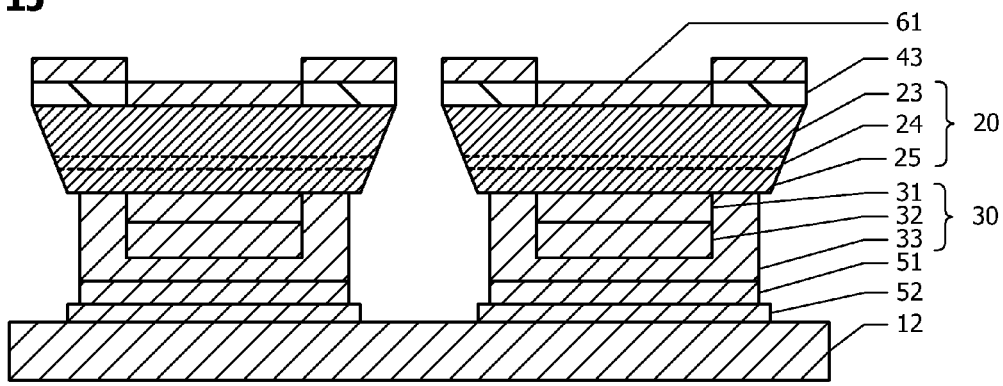

Next, an n-side electrode 61 is formed by lift-off. First, a photoresist 43 is formed by photolithography in the regions where formation of an n-side electrode 61 is not necessary as illustrated in FIG. 1J, followed by forming a Ti film with a thickness of about 1 nm and an Al film with a thickness of about 1,000 nm in this order by electron beam vacuum evaporation. Then, the photoresist 43 is removed to pattern the n-side electrode 61 as desired (by lift-off).

Figure 1K:
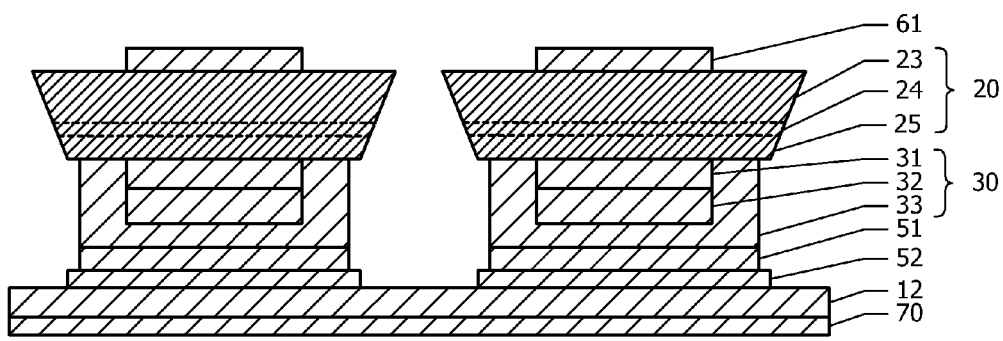
Figure 1L:
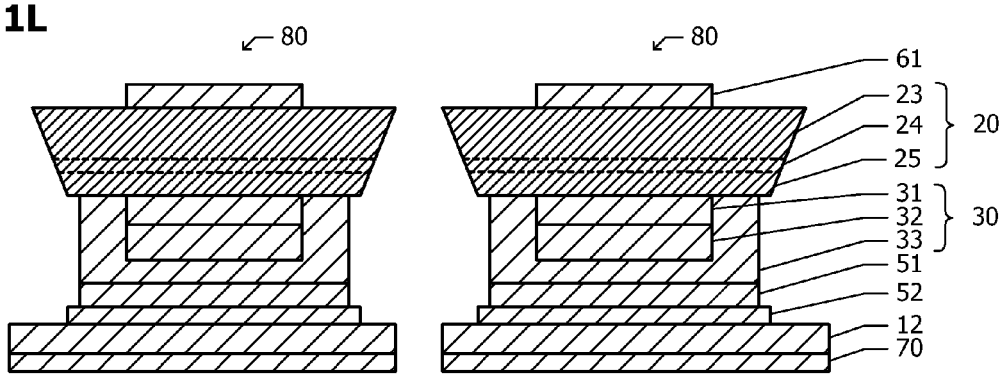

Then, the support substrate 12 is thinned by grinding and polishing as illustrated in FIG. 1K. For example, the thickness of the support substrate 12 is decreased to about 250 μm by this step. Subsequently, a contact layer 70 is formed on the surface of the thinned support substrate 12. The contact layer 70 is formed by depositing Ti, Pt, and Au in this order by, for example, electron beam vacuum evaporation. These layers have a thickness of, for example, about 50, 150, and 200 nm, respectively.

Then, the support substrate 12 is divided by laser scribing or dicing. 10 In this way, a nitride semiconductor light emitting element 80 is completed. It should be noted that a blue GaN light emitting element can be converted into white one by adding a yellow fluorescent substance to the resin used to fill the light emitting element.

Figure 2:
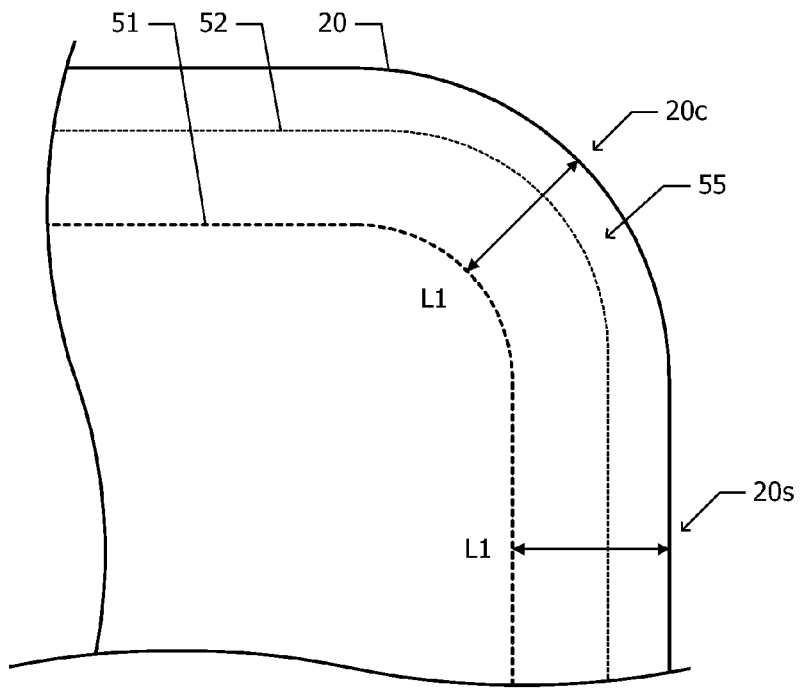
FIG. 2 is a plan view illustrating part of the layout of the semiconductor lamination and the first and second jointing layers in a semiconductor light emitting element according to a comparative example.

FIG. 2 is a plan view illustrating the layout of the semiconductor lamination 20 and the first and second jointing layers 51 and 52 in a semiconductor light emitting element according to a comparative example. In the figure, the first and second jointing layer 51 and 52 that are hidden under the semiconductor lamination 20, which has a reverse-tapered cross section relative to the support substrate, is indicated by a broken line.

Figure 4:
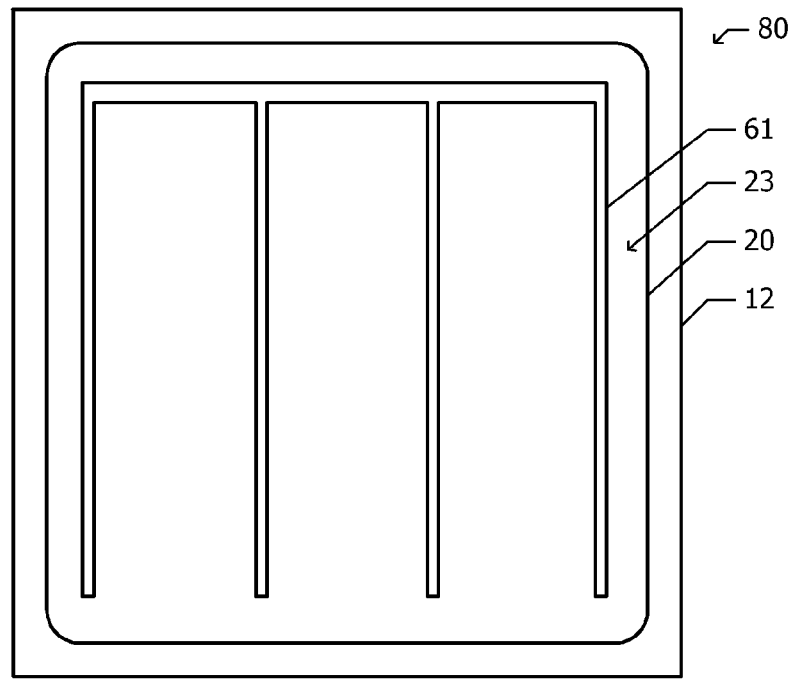
FIG. 4 is a plan view illustrating the overall plan shape of a semiconductor light emitting element according to the first embodiment.

The plan shape of the semiconductor lamination 20 contains side portions 20s and corner portions 20c along its periphery, and it may be, for example, a square with rounded corner portions 20c (see FIG. 4). The surface of the second jointing layer 52 is encompassed by that of the semiconductor lamination 20, and may be, for example, a similar one to that of the semiconductor lamination 20. The surface of the first jointing layer 51 is encompassed by that of the second jointing layer 52, and may be, for example, a similar one to that of the semiconductor lamination 20. In FIG. 2, the annular region 55 defined between the periphery of the semiconductor lamination 20 and the periphery of the first jointing layer 51 is assumed to have a width L1 in its portion corresponding to the side portion 20s of the semiconductor lamination 20 and in its portion corresponding to the corner portion 20c thereof.

If the second jointing layer 52 protrudes out of the semiconductor lamination 20, that part of the second jointing layer 52 protruding out of the semiconductor lamination 20 is irradiated with laser light in the growth substrate peeling step (see FIG. 1H). In that case, that part of the second jointing layer 52 protruding out of the semiconductor lamination 20 would generate heat and even vaporize as a result of absorbing the laser light. If material vaporized from the second jointing layer 52 should attach to the reverse-tapered side wall of the semiconductor lamination 20, the n-type semiconductor layer 23 and the p-type semiconductor layer 25 would be electrically short-circuited, making the semiconductor element unable to function as a light emitting element. Therefore, it is preferable that the second jointing layer 52 is formed so that it is encompassed by the semiconductor lamination 20 in their plan view so that it will not be irradiated with laser light in the growth substrate peeling step.

If the surface of the second jointing layer 52 is small, the jointing strength with the support substrate 12 would be insufficient. Therefore, it is preferable that the second jointing layer 52 has as large surface as possible as long as it is encompassed by the semiconductor lamination 20. It is preferable that the second jointing layer 52 is formed so that, for example, it encompasses the first jointing layer 51 while being encompassed by the semiconductor lamination 20.

Study by the present inventors has revealed that if the annular region 55 has a relatively large width L1, the peripheral portion of the semiconductor lamination 20 can be damaged by an impact that occurs when the growth substrate and the semiconductor lamination 20 are separated from each other in the growth substrate peeling step. Further study of the inventors has revealed that destruction of the semiconductor lamination 20 that may be caused due to the separation of the growth substrate can be prevented if the plan shape of the first jointing layer 51 is adjusted so as to decrease the width L1 of the annular region 55 to, for example, less than 20 μm. It has also been found however that the corner portion 20c of the semiconductor lamination 20 can be damaged relatively easily even if the width L1 of the annular region 55 is decreased to about 20 μm.

Figure 3:
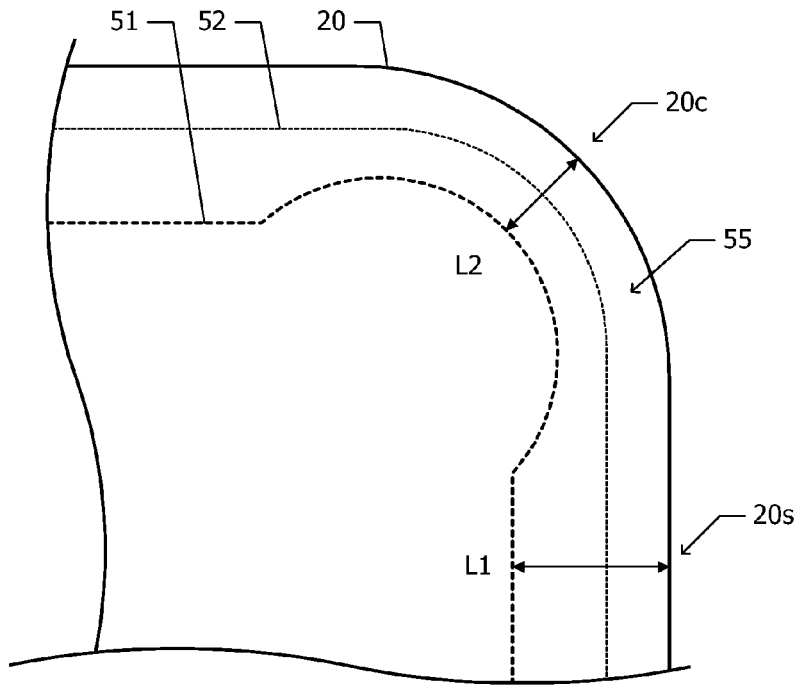
FIG. 3 is a plan view illustrating part of the layout of the semiconductor lamination and the first and second jointing layers in a semiconductor light emitting element according to the comparative example and the first embodiment.

FIG. 3 is a plan view illustrating the layout of the semiconductor lamination 20 and the first and second jointing layers 51 and 52 in a semiconductor light emitting element according to the first embodiment. The inventors produced a first jointing layer 51 in which the annular region 55 had a larger width L1 in its parts along the side portion 20s of the semiconductor lamination 20 and had a smaller width L2 in its parts along the corner portion 20c of the semiconductor lamination 20 as illustrated in FIG. 3. Specifically, a first jointing layer 51 was produced so that the width L2 of the parts of the annular region 55 along the corner portion 20c of the semiconductor lamination 20 was less than 10 μm. Study with the first jointing layer 51 having such a plan shape has indicated that the damage to the corner portion 20c of the semiconductor lamination 20 in the growth substrate peeling step is smaller than that taking place in the semiconductor light emitting element according to the reference example. This is considered to be because the jointing strength is increased as the first jointing layer 51 expands closer to the edge of the corner portion 20c of the semiconductor lamination 20. This is expected to serve to improve the yield of semiconductor light emitting element production compared to that for the semiconductor light emitting element assumed in the reference example.

FIG. 4 is a plan view illustrating the overall plan shape of the semiconductor light emitting element 80 according to the first embodiment. The n-side electrode 61 formed on the n-type semiconductor layer 23 has, for example, a comb-like shape as illustrated in FIG. 4. Here, the plan shape of the n-type electrode 61 may be, for example, ladder-like or grid-like, instead of comb-like.

Figure 5:
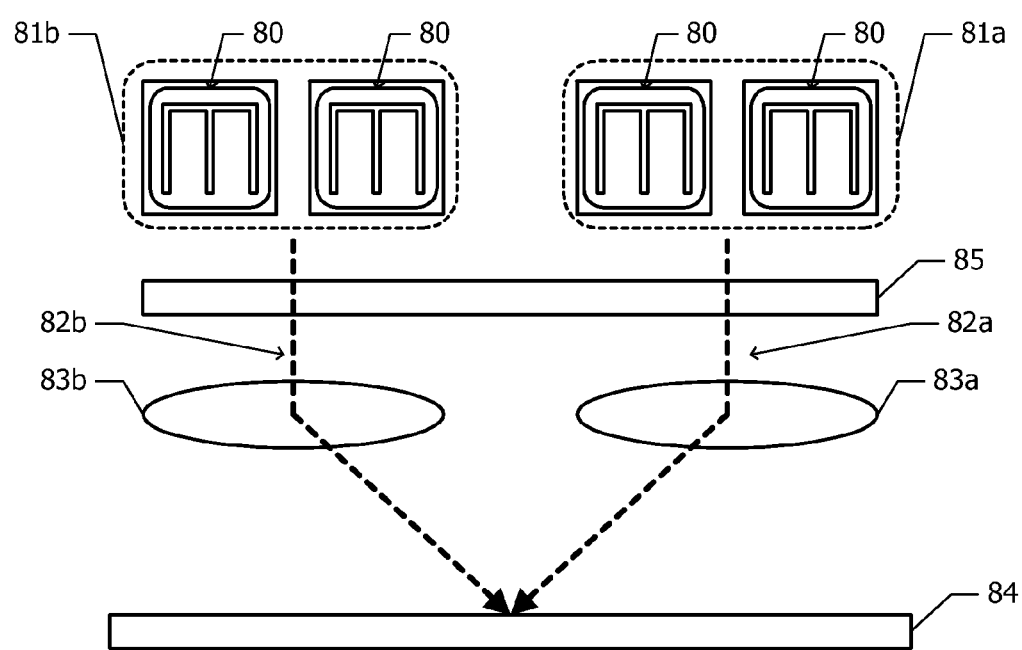
FIG. 5 is a conceptual diagram illustrating the configuration of a vehicle light employing a plurality of semiconductor light emitting elements according to the first embodiment.

FIG. 5 is a conceptual diagram illustrating the configuration of a vehicle light employing a plurality of semiconductor light emitting elements 80. The light emitting elements 80 can be used for, for example, vehicle lights. A plurality of semiconductor light emitting elements 80, for example, two semiconductor light emitting elements 80, are used to constitute semiconductor light emitting element arrays 81a and 81b. In the vehicle lights illustrated in FIG. 5, lenses 83a and 83b are located in the light paths 82a and 82b from the two semiconductor light emitting element arrays 81a and 81b, respectively. The lenses 83a and 83b are positioned so that the beams 82a and 82b come to the same point on a virtual vertical screen (irradiation plane) 84 that is located directly in front of the vehicle front. Here, a fluorescent layer (wavelength converter layer) 85 may be provided between the semiconductor light emitting element arrays 81a and 81b and the lenses 83a and 83b.

An efficient semiconductor light emitting element array can be produced by stacking a plurality of semiconductor light emitting elements on a support substrate compared to combining a plurality of individual semiconductor light emitting elements. Described below is a second embodiment in which a plurality of electrically connected semiconductor light emitting elements are stacked on a single support substrate.

The semiconductor light emitting element production method according to the second embodiment is described with reference to FIGS. 6A to 6I. The preceding steps for and before the formation of a light reflection layer for a p-side electrode are the same as those for the semiconductor light emitting element production method according to the first embodiment.

After the formation of a light reflection layer 32, an etching stop layer 34 of oxide silicon etc. that has the same height as the combined height of the transparent electrode 31 and light reflection layer 32 is formed by sputtering around the transparent electrode 31 and light reflection layer 32 on the p-type semiconductor layer 25. The etching stop layer 34 will act as etching stopper in the undermentioned etching step (see FIG. 6G).

Figure 6A:
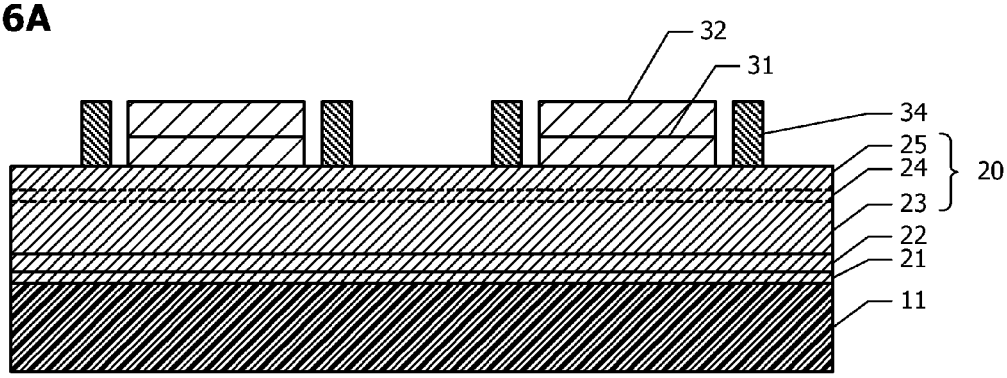
FIGS. 6A to 6I are cross sections illustrating the process for the manufacture of a semiconductor light emitting element according to a second embodiment.
Figure 6B:
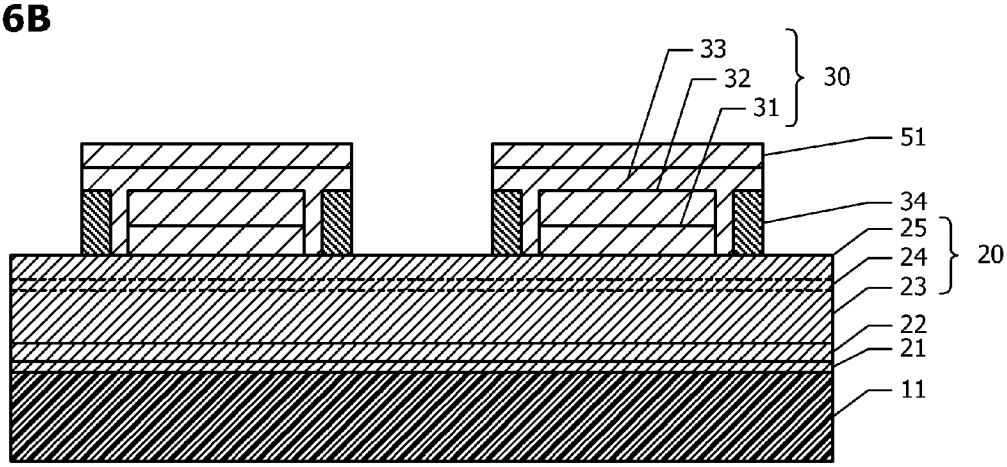

Then, a cap layer 33 of TiW with a thickness of 300 nm is formed by sputtering in a region that contains the transparent electrode 31, light reflection layer 32, and etching stop layer 34 as illustrated in FIG. 6B. The cap layer 33 serves to prevent the diffusion of materials used in the light reflection layer 32, and if Ag is contained in the light reflection layer 32, Ti, W, Pt, Pd, Mo, Ru, Ir, and alloys thereof can be used as material of the cap layer 33. In this way, a p-side electrode 30 containing a transparent electrode 31, light reflection layer 32, and cap layer 33 is formed.

Subsequently, a first jointing layer 51 made of Au etc. with a thickness of 200 nm is formed by sputtering on the cap layer 33. Here, the first jointing layer 51 has a plan shape equivalent to that of the first jointing layer according to the first embodiment.

Figure 6C:
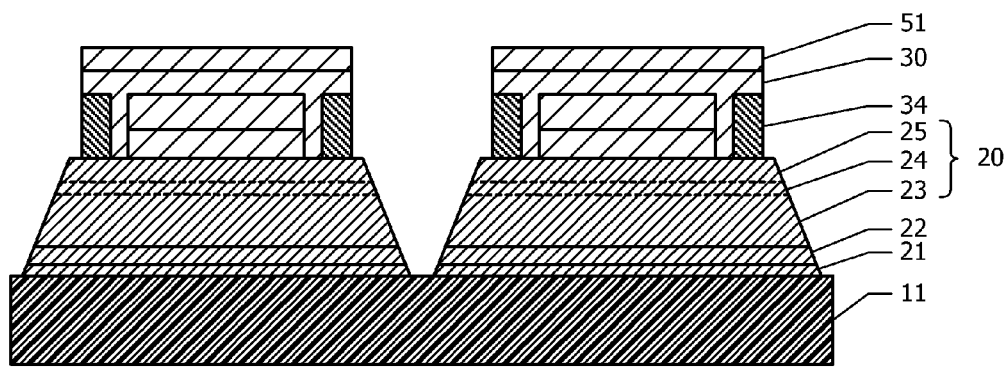

Then, the semiconductor lamination 20 is divided into a plurality of elements as illustrated in FIG. 6C. Each side face of the divided pieces of the semiconductor lamination 20 has a shape that decreases in cross section towards the top, namely, a normal-tapered shape.

Figure 6D:
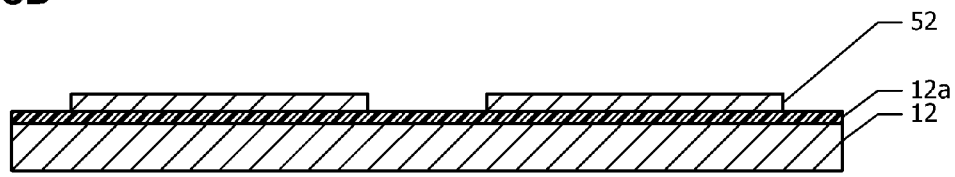

Then, a support substrate 12 of Si having a thermal oxidation insulation film 12a with a thickness about 500 nm formed on its surface is prepared, and a second jointing layer 52 of AuSn (Sn 20 wt %) etc. with a thickness of 1 μm is formed on top of it by resistance heating deposition as illustrated in FIG. 6D. It is preferable that the support substrate 12 is made of a material that has a thermal expansion coefficient close to that of sapphire ($7.5 \times 10^{-6}$/K) and GaN ($5.6 \times 10^{-6}$/K) and has a high heat conductivity. Usable materials include, for example, Si, AlN, Mo, W, and CuW. The material of the first jointing layer 51 and the material of the second jointing layer 52 may be fusion-bondable metals containing, for example, Au—Sn, Au—In, Pd—In, Cu—In, Cu—Sn, Ag—Sn, Ag—In, or Ni—Sn, or diffusion-bondable metals containing Au. Here, the second jointing layer 52 has a plan shape equivalent to that of the second jointing layer according to the first embodiment.

Figure 6E:
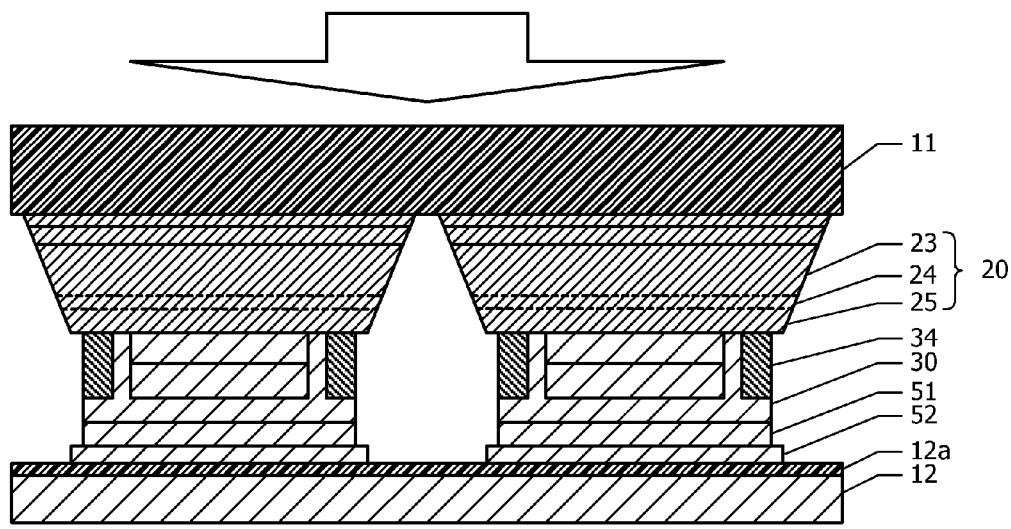

Next, as illustrated in FIG. 6E, the jointing layer 51 and the second jointing layer 52 are brought into contact with each other and heated at 300° C. for 10 min under a pressure of 3 MPa, followed by cooling to room temperature to achieve fusion bonding (joint layer). In this step, the second jointing layer 52 is disposed so that it encompasses the first jointing layer 51 while being encompassed by the semiconductor lamination 20 in their plan view.

Figure 6F:
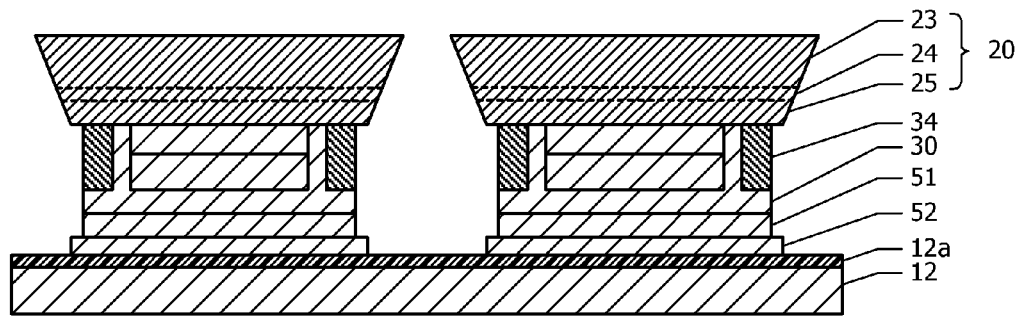

Subsequently, the back of the growth substrate 11 is irradiated with light from a UV excimer laser to cause heat decomposition of the buffer layer and foundation layer so that the growth substrate 11 can be removed by laser lift-off as illustrated in FIG. 6F.

Figure 6G:
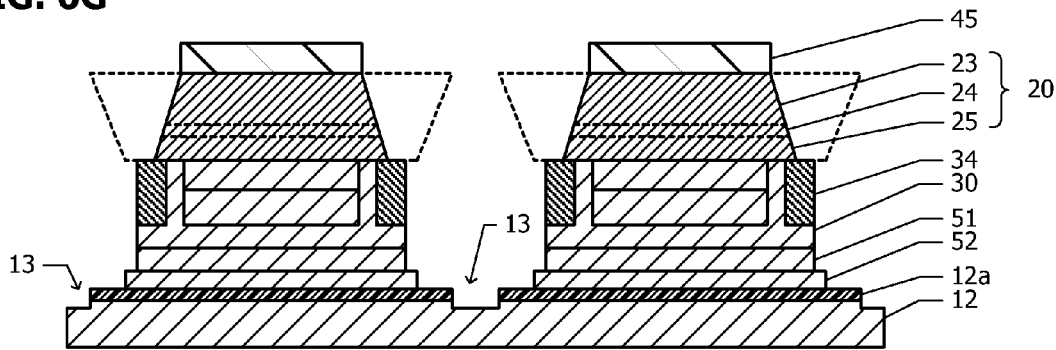

Then, as illustrated FIG. 6G, a photoresist 45 is formed in such a manner that the periphery of the semiconductor lamination 20 is exposed. Subsequently, dry etching is carried out using chlorine gas to etch the edge portions of the semiconductor lamination 20 that are not covered by the photoresist 45, thereby exposing the etching stop layer 34. Consequently, the side wall of the semiconductor lamination 20 has a normal-tapered shape in which its cross section decreases towards the top when assuming the support substrate 12 is at the bottom. Here, as the semiconductor lamination 20 is dry-etched, a groove 13 is formed on that part of the surface of the support substrate 12 (or thermal oxidation insulation film 12a) that is not covered by the semiconductor lamination 20 before being dry-etched, in their plan view. In the plan view, the region defined by the groove 13 is referred to as device region. The device region has a plan shape corresponding to that of the semiconductor lamination 20 before being dry-etched. The plan shape of the device region will be described later along with the first and second plan shapes (see FIG. 7A).

Figure 6H:
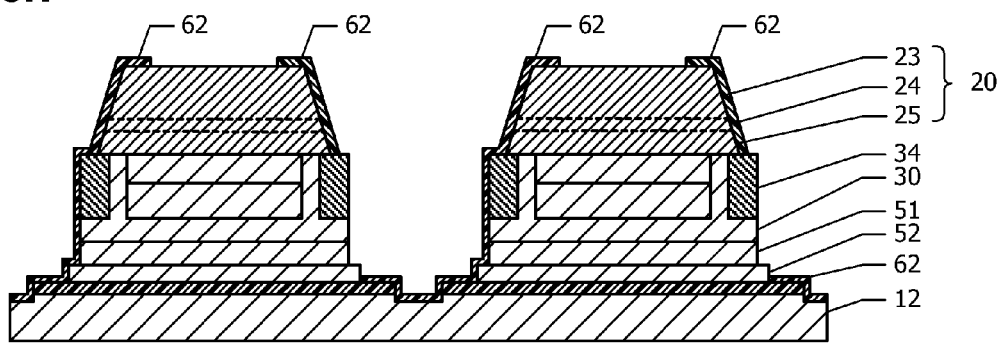

Next, as illustrated in FIG. 6H, the protection film (insulation film) 62 of silicon oxide etc. is formed by, for example, chemical vapor deposition (CVD) to cover the entire top face of the element formed in the aforementioned steps, and then part of the protection film 62 formed on the semiconductor lamination 20 is etched with buffer hydrofluoric acid, thereby exposing part of the surface of the n-type semiconductor layer 23.

Figure 6I:
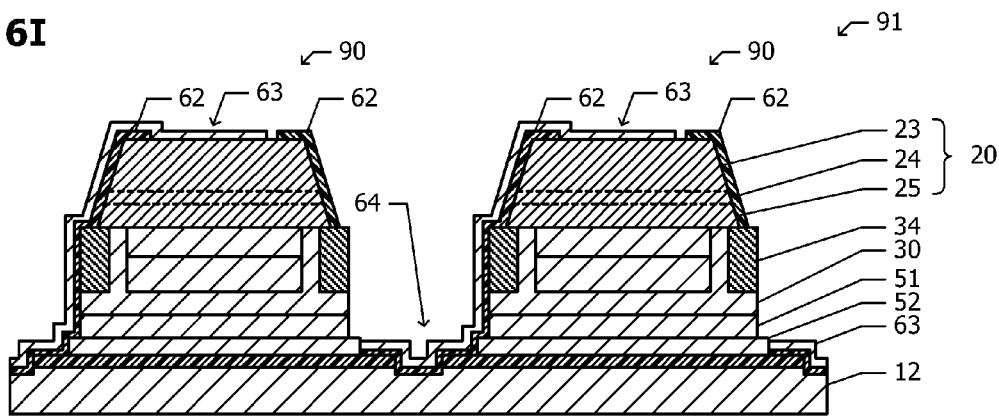

Next, as illustrated in FIG. 6I, a Ti layer with a film thickness of 10 nm, an Al layer with a film thickness of 300 nm, and an Au layer with a film thickness of 2 μm are formed in this order by electron beam deposition and patterned by lift-off, thereby simultaneously forming an n-side electrode 63 located on the surface of the n-type semiconductor layer 23 and an extraction electrode 64 that electrically connects the n-side electrode 63 to the p-side electrode 30 of an adjacent semiconductor light emitting element. Since the semiconductor lamination 20 has a normal-tapered shape relative to the support substrate 12, the extraction electrode 64 can be formed easily to ensure electric connection between a plurality of semiconductor light emitting elements. In this way, a semiconductor light emitting element array 91 composed mainly of a plurality of nitride semiconductor light emitting elements 90 stacked on a single support substrate is completed.

Figure 7A:
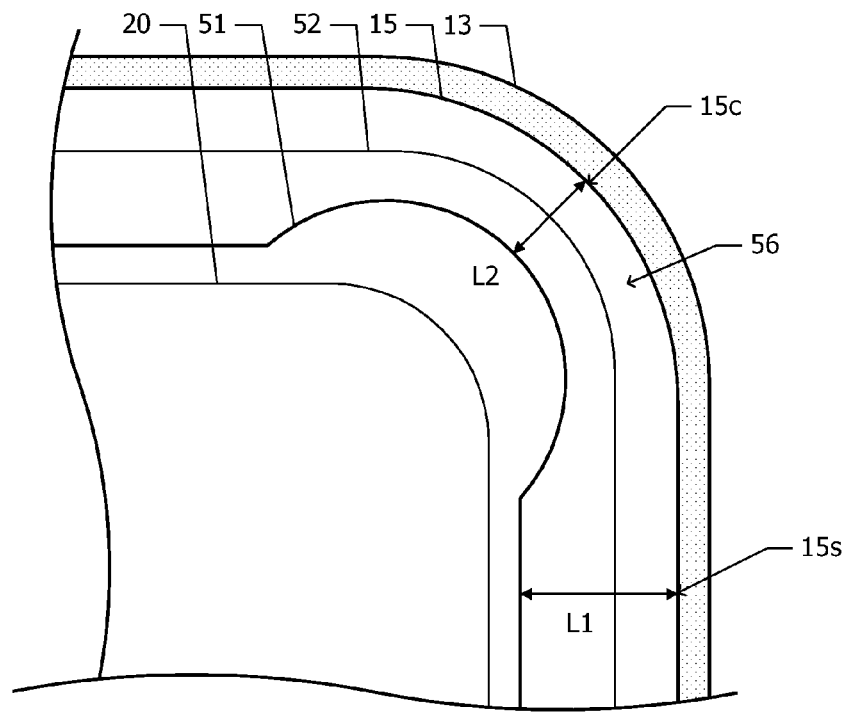
FIGS. 7A and 7B are plan views illustrating part of the layout of the semiconductor lamination and the first and second jointing layers in semiconductor light emitting elements according to the second embodiment and a modification thereof, respectively.

FIG. 7A is a plan view illustrating the layout of the semiconductor lamination 20, the first and second jointing layers 51 and 52, and the device region in a semiconductor light emitting element according to the second embodiment. The device region 15 is a region defined by the groove 13 that is formed on the support substrate surface when the semiconductor lamination 20 having a reverse-tapered shape relative to the support substrate is dry-etched in a normal-tapered shape. In the figures, the groove 13 is indicated as a dotted region.

The semiconductor lamination 20 is dry-etched so that it has a normal-tapered shape relative to the support substrate and accordingly has a plan shape that is, for example, encompassed by that of the first jointing layer 51. In the case of the second embodiment, therefore, this layout of the semiconductor lamination 20 and the first jointing layer 51 makes it impossible to determine whether the growth substrate peeling step has been carried out in such a manner that the periphery (particularly the corner portions) of the semiconductor lamination 20 is prevented from being damaged easily.

However, the device region 15 has a plan shape that corresponds to the plan shape of the semiconductor lamination 20 before being dry-etched. The annular region 56 defined between the periphery of the device region 15 and that of the first jointing layer 51 has a plan shape that corresponds to the plan shape of the annular region (the annular region 55 included in FIG. 3) defined between the periphery of the semiconductor lamination 20 before being dry-etched and that of the first jointing layer 51. This means that whether the growth substrate peeling step has been carried out in such a manner that the periphery, particularly the corner portions, of the semiconductor lamination 20 is prevented from being damaged easily can be determined easily by confirming that the width L2 of the part of the annular region 56 along the corner portion 15c of the device region 15 is smaller than the width L1 of the part along the side portion 15s of the device region 15.

Figure 7B:
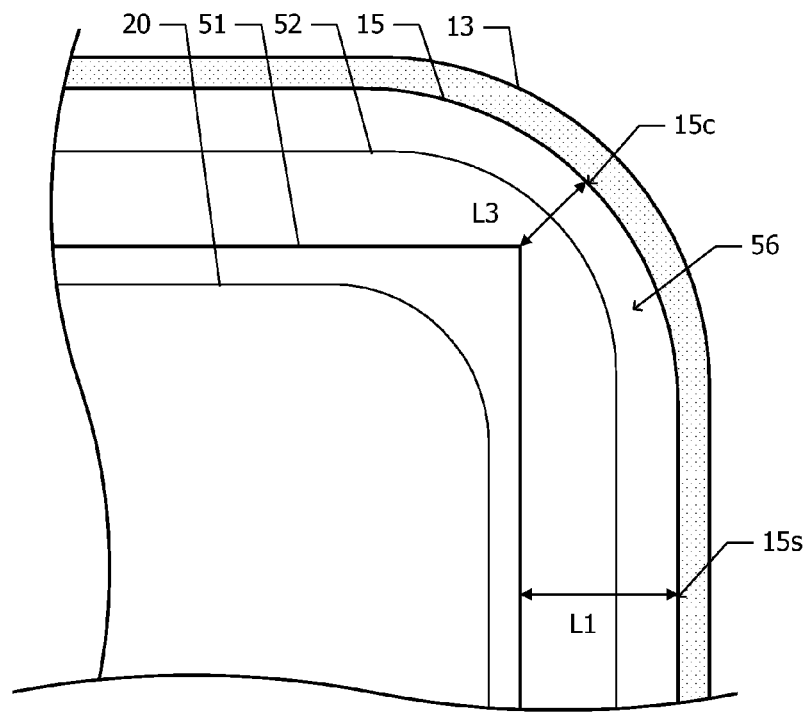

FIG. 7B is a plan view illustrating the layout of the semiconductor lamination 20, the first and second jointing layers 51 and 52, and the device region 15 in a semiconductor light emitting element according to a modification of the second embodiment. The first jointing layer 51 may have a plan shape that protrudes in the corner portions as illustrated in FIG. 7A. The curvature of that portion may be larger than that of the corner portions of the device region 15. Alternatively, the first jointing layer 51 may have a plan shape that is rectangular as illustrated in FIG. 7B instead of protruding in its corner portions. Furthermore, the second jointing layer 52 may have a plan shape protruding in its corner portions or rectangular instead of being similar to the device region 15. It should be noted that the fact that the plan shapes of the first and second jointing layers can be applied to a semiconductor light emitting element according to the first embodiment can be easily conceived by a person skilled in the art.

Figure 8A:
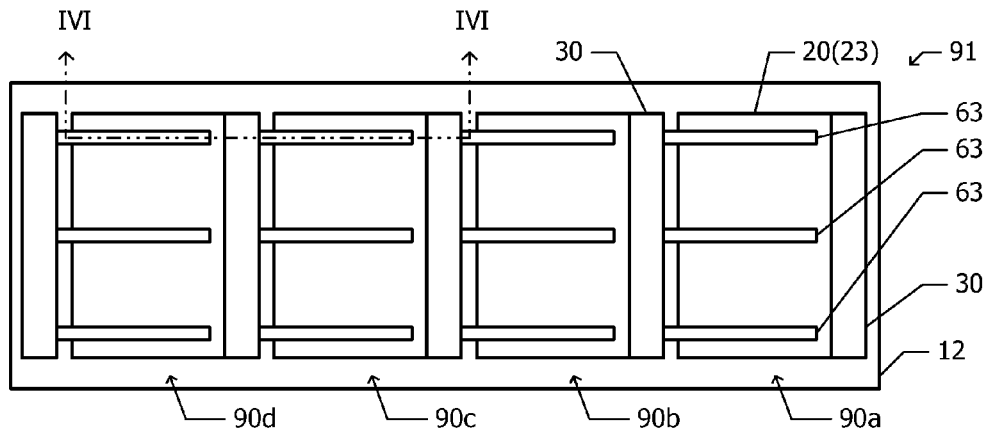
FIGS. 8A and 8B are plan views illustrating the overall plan shapes of semiconductor light emitting element arrays, each containing semiconductor light emitting elements according to the second embodiment.

FIG. 8A is a plan view illustrating the overall plan shape of a semiconductor light emitting element array 91 according to the second embodiment. Here, the line IVI-IVI in FIG. 8A corresponds to the cross section given in FIG. 6I. This figure gives an example in which four semiconductor light emitting elements 90a to 90d are formed on a support substrate 12. An n-side electrode 63 is formed on a semiconductor lamination 20 (n-type semiconductor layer 23) so as to extend in the direction of the array of semiconductor light emitting elements 90a to 90d as illustrated in FIG. 8A. The n-side electrode 63 is electrically connected to the p-side electrode 30 of an adjacent semiconductor light emitting element via an extraction electrode.

Figure 8B:
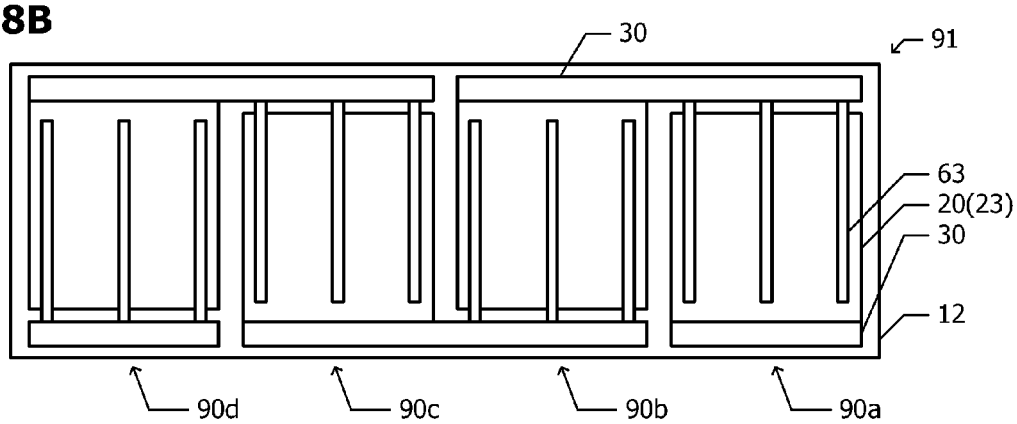

FIG. 8B is a plan view illustrating a semiconductor light emitting element array according to another modification of the second embodiment. An n-side electrode 63 is formed so as to extend in the direction perpendicular to the array of semiconductor light emitting elements 90a to 90d as illustrated in FIG. 8B. In this case, the p-side electrode 30, for example, of the semiconductor light emitting element 90b given in FIG. 8B extends to the region encompassing the semiconductor light emitting element 90a and connects to the n-side electrode 63 or extraction electrode of the semiconductor light emitting element 90a.

Figure 9:
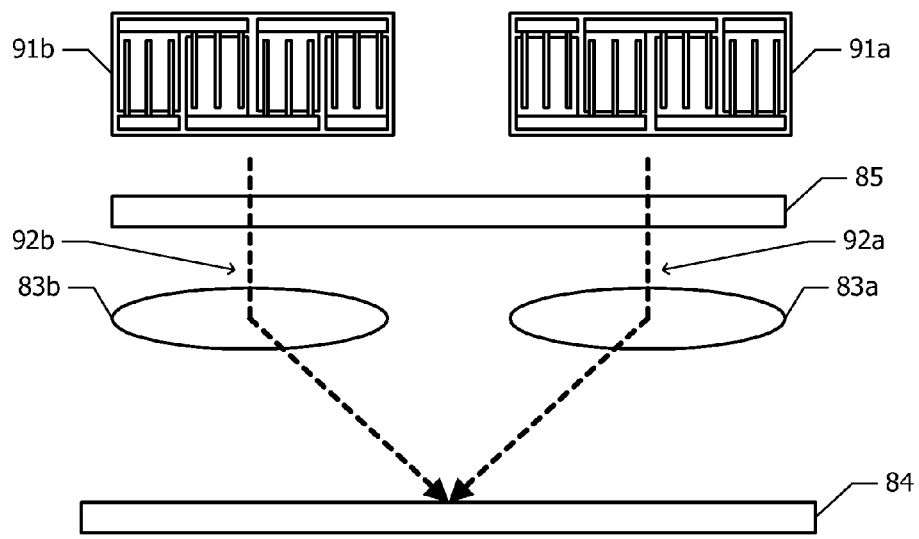
FIG. 9 is a conceptual diagram illustrating the configuration of a vehicle light employing semiconductor light emitting element arrays containing semiconductor light emitting elements according to the second embodiment.

FIG. 9 is a conceptual diagram illustrating the configuration of a vehicle light employing a plurality of semiconductor light emitting elements 91. In the vehicle light illustrated in FIG. 9, lenses 83a and 83b are installed on the light paths 92a and 92b from the two semiconductor light emitting element arrays 91a and 91b, respectively. The lenses 83a and 83b are positioned so that the beams 92a and 92b come to the same point on a virtual vertical screen (irradiation plane) 84 that is located directly in front of the vehicle front. Here, a fluorescent layer (wavelength converter layer) 85 may be provided between the semiconductor light emitting element arrays 81a and 81b and the lenses 83a and 83b.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

The invention claimed is:

1. A semiconductor light emitting element having a cross-sectional structure comprising:
   a support substrate;
   a semiconductor lamination located over the support substrate, containing at least a p-type semiconductor layer, an active layer having a light emitting characteristic, and an n-type semiconductor layer; and
   a joint layer located between the semiconductor lamination and the support substrate, containing a first jointing layer located on a semiconductor lamination side and a second jointing layer located on a support substrate side, and fixing a positional relationship between the semiconductor lamination and the support substrate by joining the first and second jointing layers,
   wherein in a plan view:
   the semiconductor lamination has corner portions and side portions along a periphery thereof;
   the first jointing layer is encompassed by the second jointing layer; and
   an annular region defined between an outline of the semiconductor lamination and an outline of the first jointing layer has first portions corresponding to the corner portions of the semiconductor lamination and second portions corresponding to the side portions of the semiconductor lamination, widths of the first portions being narrower than widths of the second portions.

2. The semiconductor light emitting element according to claim 1, wherein the widths of the first portions are 10 μm or less.

3. The semiconductor light emitting element according to claim 1, wherein the widths of the second portions are 20 μm or less.

4. The semiconductor light emitting element according to claim 1, wherein:
   the semiconductor lamination has a reverse-tapered overall cross-sectional shape relative to the support substrate; and
   the second jointing layer is, in the plan view, encompassed by the semiconductor lamination.

5. An automotive lighting comprising:
   a semiconductor light emitting element; and
   an optical system placed on a path of light emitted by the semiconductor light emitting element,
   wherein the semiconductor light emitting element has a cross-sectional structure comprising:
   a support substrate;
   a semiconductor lamination located over the support substrate, containing at least a p-type semiconductor layer, an active layer having a light emitting characteristic, and an n-type semiconductor layer; and
   a joint layer located between the semiconductor lamination and the support substrate, containing a first jointing layer located on a semiconductor lamination side and a second jointing layer located on a support substrate side, and fixing a positional relationship between the semiconductor lamination and the support substrate by joining the first and second jointing layers, and
   wherein in a plan view:
   the semiconductor lamination has corner portions and side portions along a periphery thereof;
   the first jointing layer is encompassed by the second jointing layer; and
   an annular region defined between an outline of the semiconductor lamination and an outline of the first jointing layer has first portions corresponding to the corner portions of the semiconductor lamination and second portions corresponding to the side portions of the semiconductor lamination, widths of the first portions being narrower than widths of the second portions.

6. The automotive lighting according to claim 5, wherein:
   the semiconductor lamination has a reverse-tapered overall cross-sectional shape relative to the support substrate; and
   the second jointing layer is, in the plan view, encompassed by the semiconductor lamination.

* * * * *

UNITED STATES PATENT AND TRADEMARK OFFICE
CERTIFICATE OF CORRECTION

PATENT NO.      : 9,024,332 B2                                  Page 1 of 1
APPLICATION NO. : 13/845063
DATED           : May 5, 2015
INVENTOR(S)     : Mamoru Miyachi et al.

It is certified that error appears in the above-identified patent and that said Letters Patent is hereby corrected as shown below:

On the Title page; Item (73) Assignee, delete "Stanley Electronic Co., Ltd." and insert --Stanley Electric Co., Ltd.--.

Signed and Sealed this
Twenty-third Day of February, 2016

Michelle K. Lee
*Director of the United States Patent and Trademark Office*